(12) United States Patent
Martin et al.

(10) Patent No.: US 7,176,578 B2
(45) Date of Patent: Feb. 13, 2007

(54) METHOD FOR PROCESSING A THIN FILM SUBSTRATE

(75) Inventors: Hans Evald Goran Martin, Delsbo (SE); Klas Anders Hjort, Uppsala (SE); Mikael Peter Erik Lindberg, Uppsala (SE)

(73) Assignee: Senseair AB, Delsbo (SE)

( * ) Notice: Subject to any disclaimer, the term of this patent is extended or adjusted under 35 U.S.C. 154(b) by 0 days.

(21) Appl. No.: 11/258,763

(22) Filed: Oct. 26, 2005

(65) Prior Publication Data

US 2006/0071323 A1 Apr. 6, 2006

(30) Foreign Application Priority Data

Apr. 29, 2003 (SE) .................................. 0301238
Apr. 21, 2004 (WO) ...................... PCT/SE04/00606

(51) Int. Cl.
*H01L 23/48* (2006.01)
(52) U.S. Cl. ..................... 257/774; 257/775; 257/276; 257/502; 438/629; 438/638; 438/214
(58) Field of Classification Search ................ 257/774, 257/775, 276, 502, 621; 438/629, 638, 214
See application file for complete search history.

(56) References Cited

U.S. PATENT DOCUMENTS

2003/0127736 A1* 7/2003 Eto et al. ..................... 257/737
2003/0151133 A1* 8/2003 Kinayman et al. .......... 257/713
2003/0168256 A1* 9/2003 Chien .......................... 174/264

* cited by examiner

*Primary Examiner*—Nathan J. Flynn
*Assistant Examiner*—Tan Tran
(74) *Attorney, Agent, or Firm*—John Lezdey (57) ABSTRACT

The present invention comprises a processed thin film substrate (10) and a method therefore, in order to produce a flexible printed circuit card, having a plurality of microvias going or passing through the thin film substrate and electrically connected along faced-away surfaces, in order to form an electric circuit. A first a number of real nano-tracks are filled with a first material (M1), having good electric properties, for the formation of a first number of, here denominated, first vias (V10, V30, V 50), that a second number of real nano-tracks are filled with a second material (M2), having good electric properties, for the formation of a second number of, here denominated, second vias (V20, V40, V60). The first material (M1) and the second material (M2) of said first and second vias (V10–V60) are chosen having mutually different thermoelectric properties. A material surface-applied to the thin film substrate, coated on both sides (10a, 10b) of the thin film substrate (10), is distributed and/or adapted in order to allow the electrical interconnection of first vias, allocated the first material (M1), with second vias, allocated the second material (M2), and that a first via (V10) included in a series connection and a last via (V60) included in the series connection are serially coordinated in order to form an electric thermocouple (100) or other circuit arrangement.

32 Claims, 4 Drawing Sheets

METHOD FOR PROCESSING A THIN FILM SUBSTRATE

TECHNICAL FIELD OF THE INVENTION

The present invention generally relates to a thin film substrate processed in a plurality of process or processing steps, in order to, by this processed treatment, allow a production of one or more printed circuit boards or cards.

A thin film substrate, in this application, is intended to cover a substrate having a thickness thinner than 500 µm.

By the expression printed circuit cards is primarily or in first hand intended a single thin film substrate, processed in a way that is described hereinbelow, but nothing prevents from, in a second hand, allowing an unification of a plurality of such processed thin film substrates to each other, in order to, in this way, provide a multi-layer printed circuit card, where a printed circuit card processed according to the provisions of or the advice given by the invention advantageously may be applied farthest out or surface related in such a layer structure.

The utilization of a thin film substrate enables allowing producing flexible printed circuit cards, where the flexibility decreases by the choice of the number of layers and the choice of thickness of the respective layer.

As a simplifying step, measure or purpose, the subsequent description will limit itself to a description of a single flexible printed circuit card formed on a thin film substrate only.

Each one of said flexible printed circuit cards manufactured in this manner will comprise a plurality of vias, going through or passing through the thin film substrate and, via a circuitry, cause electrical connections along faced-away surfaces, in order to, in this way, enable the formation of one or more electric circuits.

The invention builds or is based essentially on a sequential treatment of a thin film substrate, as a bulk material, carried out in a plurality of process steps, in order to, via said treatment, enable the provision of a one-layer printed circuit card.

Such a sequential treatment carried out in a plurality of process steps may advantageously be effected according to known methods and in a proposed sequence according to the following:

a; allow the entire or at least certain selected surface sections of said thin film substrate, as a bulk material, to be treated with accelerated particles, such as in the form of ions, b; allow a choice of the velocity of said particles, when they hit said surface section selected on the surface of the thin film substrate, and the mutual related mass of the particles so that the kinetic energy associated with or allocated to the particles becomes chosen high enough so that at least some particles, with a full certainty, will pass through and penetrate said thin film substrate, in order to, in this way, allow a succeeding formation of so-called nano-wires, and forming tracks, regarded as latent nano-tracks, traversing said thin film substrate, c; allow a treatment of said nano-wires or selected latent traversing nano-tracks, as in a known way, in order to, in this way, form real and co-ordinated nano-tracks, a number of which traversing completely the thin film substrate, d; to allow a filling of at least selected real nano-tracks, in a known way per se, with a material, as a suggestion with a material that has good or semi-good electrically conducting properties, for the formation of vias, traversing or going (passing) through the thin film substrate, and e; to allow an electrical interconnection of a plurality of said through-passing vias via a surface-oriented electric circuitry by means of one or preferably two material strings, applied to the faced-away surfaces of the thin film substrate, having good or semi-good electrically conducting properties.

Definitions:

Latent nano-tracks or nano-wires are intended to indicate the thin wire-like material modification that is caused by accelerated particles, preferably ions, penetrating the thin film substrates, used as a bulk material, and thereby creating generally vertical, such as anisotropic, nano-wires going through or passing through the substrate, the material structure of which nano-wires has changed to a material structure having a higher energy than the rest of the material structure of the thin film substrate and which changed material structure has turned out to be susceptible to etching, such as chemical etching, in the direction of the particle or ion migration through the thin film substrate.

Real nano-tracks are intended to indicate that, via said etching, a material structure in the above mentioned nano-tracks or nano-wires has been removed and that, in this way, thin through-holes or real tracks have been developed.

Via or microvia are intended to indicate that at least one real nano-track, preferably a co-ordination of a number of through-hole or real nano-tracks, has been filled with a material, extending between faced-away surface portions of the thin film substrate. The material chosen here may advantageously be a material having a marked or outstanding good conductivity and/or a material having a chosen semi-good conductivity.

BACKGROUND OF THE INVENTION

Methods and arrangements of the above mentioned natures are previously known in a plurality of different embodiments.

By way of introduction, it may be mentioned that the understanding about accelerated particles or ions, penetrating or penetrated through an electrically insulating material, forming nano-tracks or nano-wires was apparent and utilized already during the 1960's, because these were considered significant within geology and cosmology, where cosmic particles, which reached through the atmosphere of the earth, created permanent tracks in many insulating material, a technology which also will be utilized in the present invention.

As a time-wise more closely related example of the background of the invention and the technical conditions that the invention is based on, the contents in a publication ISSN 1104-232X or ISBN 91-554-5515-8, entitled "High Aspect Ratio Microsystem Fabrication by Ion Track Lithography" by Mikael Lindeberg may be mentioned.

In said publication, page 52 and in FIG. 49, it is illustrated how an inductor coil, shaped as a solenoid, may be constructed by means of a number of vias or microvias connected in series, where all microvias are formed from one and the same metal material and oriented parallel through a thin film substrate and with the faced-away surfaces of said thin film substrate having been provided with the requisite circuitry in order to electrically and by means of the same metal material be able to interconnect the formed microvias as a coil, and thereby form a flexible circuit arrangement and with the process mentioned by way of introduction having come to a utilization.

Flexible circuit arrangements manufactured in this manner should be able to be compared with application of printed circuits on a printed circuit card or a printed board.

A technical field, relevant for the present invention, and where an advantageous application can be expected is shown and disclosed in an International Patent Publication allotted the publication number WO-A1-99/41592.

Here, a number of methods and a gas sensor-associated detector are shown and disclosed.

Among other things, a method is provided in order to enable the production of a gas sensor-associated detector and intended to enable the detection of electromagnetic waves, such as infrared light rays, passing through a gas cell (2), said gas cell forming a cavity (21), adapted to be able to contain an amount of gas (G), intended for a measurement or an evaluation, with the surface or parts of the surface, which form wall portions (21C, 21D, 21E) inside said gas cell (2) or cavity (21), being coated with one or more different metal layers (M1, M2), with the intention to enable the formation of a high reflective surface for said electromagnetic waves.

Said detector (3) consists of one or more light-receiving means, in the form of thermal elements, formed on an electrically non-conducting substratum, having a surface area or surface areas exhibiting a topographic structure, which areas are coated with a first and a second electrically conducting metal layer, said first and second metal layers being applied against the topographic surface structures at angles of incidence, separated from each other by 90°.

More particularly, said gas cell-associated cavity (21) should be formed by means of a cup-shaped, a first, part (2A) and a part portion (2B), denominated a second part, of a substratum (B).

The detector-associated topographic structure (3) should be allocated a first part section for said substratum (B) and/or a part section of said cup-shaped part.

Said substratum (B) should likewise have one or more additional part sections, adapted to form a detector-associated circuit arrangement (1b).

SUMMARY OF THE PRESENT INVENTION

Technical Problems

If attention is paid to the circumstances that the technical considerations a person skilled in the relevant technical field has to make, in order to be able to present a solution to one or more technical problems raised, initially are a necessary insight in the measures and/or the sequence of measures that should be taken as well as a necessary choice of the means that is or are required, the subsequent technical problems should, in view of this, be relevant in the creation and forming of the present subject of invention.

While taking the prior art into consideration, as it has been described above, it should, therefore, be seen as a technical problem to be able to realize the significance of, the advantages associated with and/or the steps to be taken, while utilizing a thin film substrate, as a bulk material, and a treatment of such a thin film substrate as mentioned by way of introduction, allowing to create conditions in order to—according to the fundamental conditions known in order to, using one and the same metal material, allow the formation a toroidal inductance on a thin film substrate—form an electric thermocouple, having cold and hot joints and/or form an electric circuit arrangement, while utilizing a plurality of conducting or semi-conducting materials.

It should, in that connection, be seen as a technical problem to, by means of at least two different materials, such as metal materials, enable the provision of a light-detecting unit constructed inside a thin film substrate, which unit is applicable in the technical field that has been described in the International Patent Publication mentioned by way of introduction.

Furthermore, it should be seen as a technical problem to enable the formation of an electric thermocouple, using or built on microvias oriented through a thin film substrate, where one surface of the thin film substrate should be able to serve as a hot joint and the faced-away second surface thereof should be able to serve as a cold joint.

It should also be seen as a technical problem to be able to realize the significance of and the advantages associated with, while utilizing a thin film substrate, through which a number of nano-tracks and microvias extend, being able to provide a number of electric circuit arrangements, while utilizing said real nano-tracks, processed in order to form microvias, having equal or different metal materials or other materials suitable for the selected end area or result.

In that connection, there is a technical problem in being able to realize the significance of and the advantages associated with, for certain first selected microvias, allowing to choose a first metal material, for certain second selected microvias, allowing to choose another metal material and for certain third selected microvias, allowing to choose a third material etc.

Furthermore, it is to be considered as a technical problem to be able to realize the significance of and the advantages associated with, for certain selected microvias, allowing to choose a material having electrically semi-conducting properties.

In that connection, there is a technical problem in being able to realize the significance of and the advantages associated with allowing the different metal materials included in a thermal element to be formed and supplied to adjacent and co-ordinated microvias extending completely through the thin film substrate.

There is also a technical problem in being able to realize the significance of and the advantages associated with, for such a thermocouple, allowing a first number of real nano-tracks formed in this manner to be filled with a first material, having chosen electric or other properties, for the formation of a first number of, here denominated, first vias or microvias and allowing a second number of nano-tracks formed in this manner to be filled with a second material, having chosen electric or other properties, for the formation of a second number of, here denominated, second vias or microvias, wherein the first material and the second material of said first and second vias should be chosen having mutually different thermoelectric properties, for the generation of a temperature-dependent electro-mechanic force (EMF).

Hence, it is a technical problem in being able to realize the significance of and the advantages associated with allowing an electrically conducting material surface-applied to the thin film substrate, as a circuitry, to be applied to both sides of the thin film substrate, and further to be distributed and/or adapted in order to, via a chosen and assigned circuitry, electrically allowing to interconnect, such as in a series connection, first vias, allocated a first material, with second vias, allocated a second material and/or provide a parallel connection, such as a plurality of such series connections.

Furthermore, there is a technical problem in being able to realize the significance of and the advantages associated with allowing a first via, included in a series connection, and a last via, included in the said series connection, be coordinated via the assigned surface-related circuitry in order to form an electric thermocouple, adapted for the purpose and having a number of hot joints located on one of the sides or surfaces of the thin film substrate and having a number of cold joints located on the faced-away second side or surface of said thin film substrate.

There is a technical problem in being able to realize the significance of and the advantages associated with allowing a thin film substrate processed in this manner to be adapted to be able to serve as one or more light receivers, such as frequency-adapted light receivers inside a detector adapted for spectral analysis, and where a first surface section of the thin film substrate then could be adapted as a first electric thermocouple, for a first chosen frequency, and where a second surface section of the same thin film substrate could be adapted as a second electric thermocouple, for a second chosen frequency.

There is also a technical problem in being able to realize the significance of and the advantages associated with allowing selected surface sections, a larger or smaller part of or the entire outer surface of the thin film substrate, to be treated with heavy accelerated particles or ions, in order to, after a treatment of nano-wires into real nano-tracks and into microvias, create conditions for, in addition to said thermocouple, likewise being able to create conditions for an electric circuitry adapted to other electric circuits and/or circuit arrangements, which advantageously may comprise semi-conducting components.

There is a technical problem in being able to realize the significance of and the advantages associated with allowing a kinetic energy, allocated to the particles or ions, be chosen high enough so that at least a chosen part, such as 80%, of the particles with satisfactory certainty will pass through said thin film substrate and thereby form traversing and completely penetrating latent nano-wires, which co-ordinated and processed can form one or more microvias, having a chosen density and/or a selected resistance value.

It is also a technical problem to be able to realize the significance of and the advantages associated with allowing said real nano-tracks to be formed and/or co-ordinated by means of a method similar to a masking process, in the following named a "tenting" process, (the meaning thereof is to treat only parts of a surface) in the first hand in order to allow first selected and co-ordinated, adjacent related, microvias to form said electric thermocouples and, in the second hand, in order to allow second selected and co-ordinated, adjacent related, microvias to form an electric circuitry of another type than said electric thermocouples.

There is also a technical problem in being able to realize the significance of and the advantages associated with allowing first selected real nano-tracks, via a chosen process and a chosen first masking or tenting, be filled with a first electrically conducting material in order to form said first vias and allowing second selected real nano-tracks, via a chosen process and a chosen another masking or tenting, however preferably the same process, be filled with a second electrically conducting material in order to form said second vias.

There is a technical problem in being able to realize the significance of and the advantages associated with allowing a selected plurality of adjacent related first micro-vias and a selected plurality of adjacent related second microvias to be electrically interconnected via an electric circuitry formed by an electrically conducting material applied to one of the two surfaces of the thin film substrate via masking or tenting process, and where said same material likewise can be utilized, via an electric circuitry, for another electric circuitry.

There is a technical problem in being able to realize the significance of and the advantages associated with allowing a plurality of first microvias and a plurality of second microvias to be electrically interconnected via an electric circuitry formed by a material applied to the second one of the two surfaces of the thin film substrate via masking or tenting, and where said material likewise can be utilized and formed, via an electric circuitry, for other electrical connections than an electric thermocouple.

Hence, it is a technical problem in being able to realize the significance of and the advantages associated with allowing said latent traversing nano-tracks, which initially consist of co-ordinated nano-wires of affected bulk material, which are susceptible to chemical etching for the formation of real nano-tracks and subsequently treated for forming microvias, and to simultaneously allow the choice of microvias and/or a co-ordination of such microvias in order to form the requisite electric circuitry for electric circuits and components outside the electric circuits that are required for the electric thermocouple.

There is a technical problem in being able to realize the significance of and the advantages associated with allowing said thin film substrate to be selected from a plastic material and assigned a total thickness between 200 and 30 μm, in order to, in this way, allow the adaptation of the thickness to a chosen length for each one of the microvias that are to be included in an electric thermocouple, active during the utilization of pulsated light waves having a chosen frequency, suitable for a gas detection inside a cavity and/or evaluation of the current gas concentration.

There is a technical problem in being able to realize the significance of and the advantages associated with allowing said thin film substrate to consist of an aromatic polymer material, where an etching can be executed in alkaline and/or oxidizing wet environment, during the utilization of chemical agents for the formation of open real nano-tracks.

Hence, it is a technical problem in being able to realize the significance of and the advantages associated with, in the application taught here, creating conditions so that the kinetic energy will be chosen to be between 200 and 7000 MeV per ion, however usually less than 2000 MeV per ion.

There is also a technical problem in being able to realize the significance of and the advantages associated with allowing to provide said nano-wires inside a plastic by means of "Coulomb" explosions and/or via a thermal transient.

Hence, it is a technical problem in being able to realize the significance of and the advantages associated with allowing the treatment of traversing latent nano-wires or latent nano-tracks, in order to form real nano-tracks traversing the thin film substrate, to be effected by utilizing a sodium hypochlorite (NaOHCl)- and/or potassium oxide (KOH)-containing solution.

There is a technical problem in being able to realize the significance of and the advantages associated with allowing such formed real traversing open nano-tracks to be pre-processed, such as by ethanol, for a wetting of the inner track surfaces.

The Solution

The present invention relates to and comprises of a processed thin film substrate and a method for producing suck thin film substrate and is, in that connection, based on the known technique taught by way of introduction, which has been exemplified by way of introduction and in the preamble of the appended claim 1.

In order to be able to solve one or more of the above-mentioned technical problems, the present invention in particular teaches that the technique known in this manner should be supplemented in order to, among other things, enable the formation of one or more electric thermocouples or electric circuit arrangements to a thin film substrate, by the fact that a first a number of real nano-tracks should be filled with a first material, having chosen electric properties, for the formation of a first number of, here denominated, first vias or microvias, that a second number of real nano-tracks should be filled with a second material, having chosen electric properties, for the formation of a second number of, here denominated, second vias or microvias and that the first material and the second material of said first and second vias are chosen having mutually different electric properties.

Furthermore, it is taught and suggested that a material surface-applied to the thin film substrate, coated on both sides of the thin film substrate, should be distributed and/or adapted to, via a formed circuitry, allow the electrical interconnection of first vias, allocated said first material, with second vias, allocated said second material, third vias allocated a material having electrically conducting or semi-conducting properties and the like.

In addition, it is taught and suggested that a first via included in a series connection and a last via included in a series connection should be able to be co-ordinated in order to form an electric thermocouple and/or another electrical connection arrangement.

As proposed embodiments, falling within the scope of the basic idea of the present invention, it is taught and suggested that the processed thin film substrate of a thermocouple should be adapted to be included as one or more frequency significative signal receivers in a detector adapted for spectral analysis.

Furthermore, it is taught that a large part of or the entire outer surface of the thin film substrate should be treated with heavy accelerated particles, where the kinetic energy allocated to the particles or ions should be chosen so that at least 80% of the particles with full certainty will pass through the thickness of said thin film substrate.

Furthermore, it is taught that real nano-tracks should be able to be formed by means of a masking or tenting and that selected real nano-tracks, via a chosen process, should be able to be filled with a first electrically conducting material, in order to form first vias, while second selected real nano-tracks, via a chosen process, should be able to be filled with a second electrically conducting material, in order to form second vias.

Thus, according to the invention, it is taught that a plurality of first vias and a plurality of second vias should be able to be electrically interconnected by a material in the form of a circuitry and applied to one of the two surfaces of the thin film substrate via masking or tenting.

Furthermore, it is taught and suggested that a plurality of first vias and a plurality of second vias should be electrically interconnected by a material in the form of a circuitry and applied to the second one of the two surfaces of the thin film substrate via masking or tenting.

Furthermore, it is taught and suggested that latent traversing nano-tracks, which consist of initially co-ordinated nano-wires, in the form of vertical wires of an anisotropic material, which is susceptible to chemical etching for the formation of sub-micron capillary, alternatively real nano-tracks.

Furthermore, it is taught and suggested that said thin film substrate should be selected from a plastic material (polymer) and assigned a thickness between 200 and 30 µm.

Furthermore, it is taught and suggested that said thin film substrate should consist of an aromatic polymer material, where an etching can be executed in an alkaline and/or oxidizing wet environment during the utilization of chemical agents for the formation of open or real nano-tracks and where the kinetic energy should be chosen to be between 200 and 7000 MeV per ion, depending on chosen particle or ion and selected material in the thin film substrate and the assigned thickness thereof.

Furthermore, the invention teaches and suggests that selected nano-wires or latent traversing nano-tracks should be processed in order to form real nano-tracks in polyimide and/or polycarbonate plastic and traversing the thin film substrate by means of a sodium hypochlorite-containing and/or potassium oxide-containing solution.

Furthermore, it is taught and suggested that said formed real traversing open nano-tracks may be pre-processed, such as with ethanol, for a wetting of inner track surfaces.

Advantages

The advantages that foremost can be regarded as characteristic of the present invention and the special significative features provided thereby are that, in this way, conditions have been created in order to, by means of a processed thin film substrate, such as of an electric thermocouple and/or one or more circuit arrangements, enable the creation of such conditions that such a thermocouple should be able to be included in one or more circuit arrangements, such as one or more signal receivers in a detector adapted for spectral analysis.

In a thermocouple application, conditions have been created to allow a number of hot joints to be exposed to light rays or waves having a frequency that is chosen from a spectral analysis and with a number of cold joints becoming located in the shadow of the light rays, and thereby there is offered a simple possibility of being able to adapt the length of the microvias included in the thermocouple directly to the thickness of the thin film substrate, and thereby conditions have been created to enable the adaptation of occurring temperature difference during the utilization of a pulsed light source.

Furthermore, conditions have been created for a controlled heat conduction into the thin film substrate, an adaptation of the resistance value of the respective microvia, and an adaptation of occurring heat conduction between hot joints and cold joints via the structure of utilized microvias and the material and thickness of the thin film substrate.

What foremost can be regarded as characteristic of the present invention is defined in the characterizing clause of the subsequent claim 1.

BRIEF DESCRIPTION OF THE DRAWINGS

A previously known method, in order to allow the treatment of a thin film substrate in a way adapted to the invention, together with a presently proposed embodiment, having the significative features associated with the present invention, will now, for the sole purpose of exemplifying the embodiment of the present invention, be described more closely, reference being made to the accompanying drawing, wherein.

DESCRIPTION OF RELATED PRIOR ART

Figure 1:
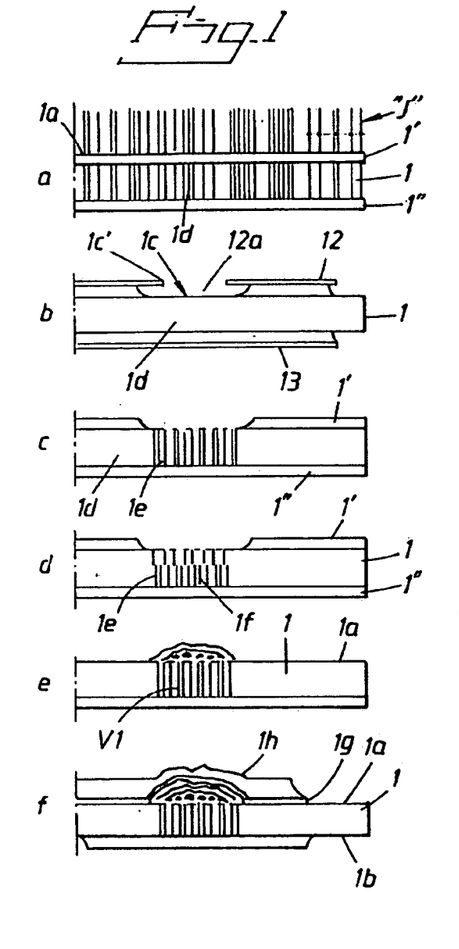
FIG. 1 shows a known method for processing a thin film substrate within the sequences "a"–"f", in order to, from one and the same metal material, allow a formation of a toroidal inductor coil by using microvias oriented through a thin film material.
Figure 2:
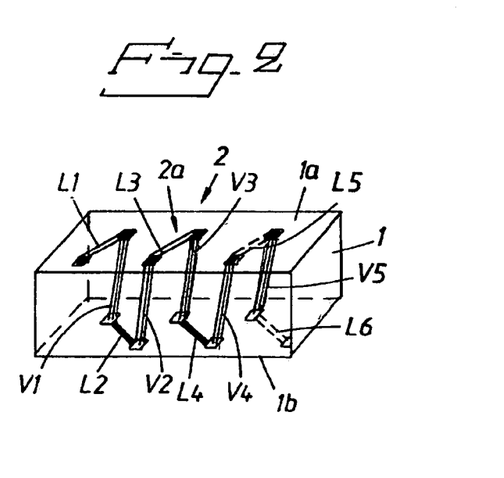
FIG. 2 shows in a perspective illustration an inductor coil, made according to the method in FIG. 1.
Figure 3:
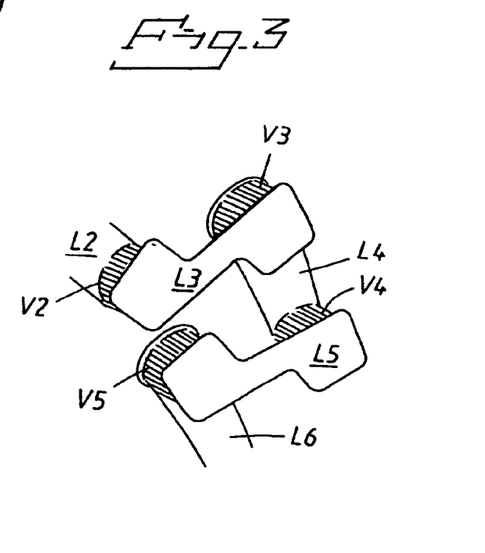
FIG. 3 shows a number of vias in the inductor coil, with the associated surface-structured circuitry, however, with the bulk material having been shown removed.

With a reference to FIGS. 1 to 3, here, in FIG. 1, a previously known method is shown in order to, in a number of process steps, allow the treatment of a thin film substrate, in accordance with the technical prerequisites that are seen in the publication mentioned by way of introduction.

Thus, a proposed sequence is shown in FIG. 1 in order to, within different process steps, designated "a" to "f", allow the treatment of a thin film substrate 1 in order to, in this way, enable the production of a printed circuit card 2, in FIG. 2, having a plurality of microvias going or arranged completely through the thin film substrate 1 and electrically connected at faced-away surfaces 1*a*, 1*b*, in order to, in this way, enable the formation of an electric circuit arrangement, in the form of a toroidal inductor coil 2*a*.

For the purpose of simplification, solely the utilization of five microvias is shown in FIG. 2, designated "V1", "V2" to "V5", with the practical application requiring a considerably greater number, and a considerably more dense structure, than the one here shown.

In FIG. 1*a*, it is illustrated that the entire thin film substrate 1 is treated with accelerated particles, in the form of ions "J" and that, in that connection, a number of nano-wires 1*d* or latent nano-tracks 1*d* are formed by the penetration of these ions.

As ion "J", 1000 MeV $^{129}Xe^{27+}$ may advantageously be utilized, which has proved to be suitable for passing through a polyimide-structured plastic, in the form of a thin film substrate 1.

In FIG. 1*a*, the thin film substrate 1 is covered by a first, an upper, thin copper layer 1' and a second, a lower, thin copper layer 1".

FIG. 1*b* illustrates that the top side 1' and the bottom side 1" of the thin film substrate 1, have been coated with one copper layer 12 and 13 each and with the upper copper layer 12 being assigned an opening 12*a*.

More particularly, the copper layer 12 is processed in order to define an opening 12*a* next to a desired microvia, say the via "V1" in FIG. 2.

The nano-wires 1*d* are processed in FIG. 1*c* so that real nano-tracks 1*e* are formed.

FIG. 1*c* also intends to illustrate that the velocity of said ions or particles "J", when they hit the surface section, and the mass of the particles mutually are so adapted to such values that the kinetic energy associated to the particles "J" will be chosen so that at least some particles with full certainty will pass completely through said thin film substrate 1, in order to, in this way, allow the formation of a number of nano-wires 1*d* or latent nano-tracks completely traversing said thin film substrate.

FIG. 1*d* shows that said real nano-tracks 1*e* in a known way are to be filled with a metal material 1*f*, having extremely good electrically conducting properties, for the formation of through-hole related microvias, such as via "V1".

Furthermore, FIG. 1*d* shows that nickel or copper is deposited inside the pores or the real nano-tracks 1*e* in two steps, via a process known as electrodeposition.

Since the pores or the real nano-tracks 1*e* extend through the entire thickness of the thin film substrate 1 towards the lower layer 1", this could consist of a support portion, alternatively an adhesive tape is utilized.

In FIG. 1*c*, also a pre-cleaning of the through-hole or real nano-tracks 1*e* may be effected using ethanol, in order to improve a wetting of the real nano-tracks.

In FIG. 1*e*, it is illustrated that the upper copper layer 1' has been removed before the material via the electrodeposition reaches the same.

A first electrodeposition is adapted to serve as a protection for the copper layer or the copper film 1" against etching liquid.

Then the electrodeposition follows.

When the microvia "V1" has grown towards the upper surface 1*a* of the thin film substrate 1, a "cup" is formed and the deposition is stopped.

FIG. 1*f* also illustrates that one of said through-hole related vias "V1" now can become electrically interconnected by means of one or two materials applied to the faced-away surfaces of the thin film substrate as circuitry and having electrically conducting properties.

FIG. 1*f* allows to illustrate, in this respect, that a thin gold film 19 has been evaporated against the upper surface 1*a* and that a copper film 1*h* has been applied thereabove.

The requisite circuitry on the top side (and the bottom side) may now be produced via isotopic wet etching.

Here, FIG. 2 illustrates an inductor coil, with only five vias being illustrated, having the requisite first conducting wires, here designated "L1", "L3" and "L5", applied to the upper surface 1*a* of the thin film substrate, and connected in order to, by means of second conducting wires, here designated "L2", "L4" and "L6", applied to the faced-away surface 1*b* of the thin film substrate, provide a series connection of the vias "V1", "V2" to "V5" into an inductor coil.

Here, FIG. 3 in principal illustrates the appearance of said vias "V2", "V3" and "V4" and with the circuitry "L3", "L5" on the top side 1*a* illustrating interconnected microvias in the way that FIG. 2 shows, in addition to a circuitry "L4" on the bottom side 1*b*.

All conducting wires on the top side 1*a*, all microvias through the thin film substrate and all conducting wires on the bottom side 1*b* are formed from one and the same metal material.

DESCRIPTION OF NOW PROPOSED EMBODIMENT

It should then by way of introduction be emphasized that in the subsequent description of a presently proposed embodiment, which has the significative features associated with the invention and which is elucidated by FIGS. 4 to 10 shown in the appended drawings, it has been chosen terms and a particular terminology with the intention to thereby primarily allow to make clear the fundamental idea of the invention.

It should, however, in this connection be taken into consideration that expressions chosen here should not be seen as limiting solely to the terms utilized and chosen here, but it should be understood that each term chosen in this manner should be interpreted so that it, in addition, comprises all technical equivalents that operate in the same or substantially the same way, in order to, in this way, enable the achievement of the same or substantially the same intention and/or technical effect.

Thus, with a reference to FIG. 4, there is schematically shown the fundamental conditions and requirements for the present invention and with the significative peculiarities or features associated with the invention generally having been made concrete, by a now proposed embodiment, together with suitable presently proposed processes, shown more closely in the following in the appended drawings by FIGS. 4 to 10, and described more closely in the following description.

Thus, the present invention is in principle based on the method that for another technical field and application has been taught in FIGS. 1 to 3, and where a plurality of adaptations are required in order to, from this technique, enable the provision of one or more electric circuit arrangements, which in the following will be exemplified as a thermocouple, which in an application for gas metering is adapted to serve as a detector.

In that connection, the present invention teaches that a first number of real nano-tracks 1*e*, here illustrated as three, should be filled with a first material M1, having good electric properties, for the formation of a first number of, here denominated, first microvias, designated "V10", "V30" and "V50", in accordance with what principally has been shown in FIG. 1*e*.

However, the invention teaches or suggests that a second number of real nano-tracks 1*e*, here illustrated as three, should be filled with a second material M2, having good electric properties, for the formation of a second number of, here denominated, second microvias, designated "V20", "V40" and "V50", and this may then be effected in accordance with what principally has been taught in FIG. 1*e*, however on the condition that the first vias "V10", "V30" and "V50" should be covered and masked and that the second real nano-tracks should be exposed for access by the second material M2.

The method and process steps associated hereby are more closely shown and described in FIGS. 8, 9 and 10, and which will be described more in detail in the following.

Of importance for the illustrated embodiment, according to the present invention, as of a thermocouple 100, is that the first material M1 and the second material M2 of said first and second microvias should be chosen with mutually different electrical-thermal properties, for the formation of one or more co-ordinated or separated electric thermocouples, which give an electromotive force (EMF) at a temperature difference between hot (10*a*) and cold (10*b*) joints.

In that connection, the invention is based on the understanding that different metals have different electrical-thermal properties when they are united end against end with each other under a temperature difference.

Thus, the invention is based on, from known experiments, allowing the determination of desired thermoelectric properties between desired materials.

The electrically conducting material surface-applied 10*a* and 10*b* to the thin film substrate 10, coated on both sides of the thin film substrate 10, is distributed and/or adapted in order to, by means of a formed electric circuitry L10, L30, L50, allow the electrical interconnection of first microvias "V10", "V30" and "V50", allocated the first material M1, with second micovias "V20", "V40" and "V50", allocated the second material M2.

A first microvia "V10" included in a series connection and a last micro-via "V50" included in said series connection, are co-ordinated to form an electric thermocouple 100 connected in series via connections 101 and 102.

Figures 4, 5:
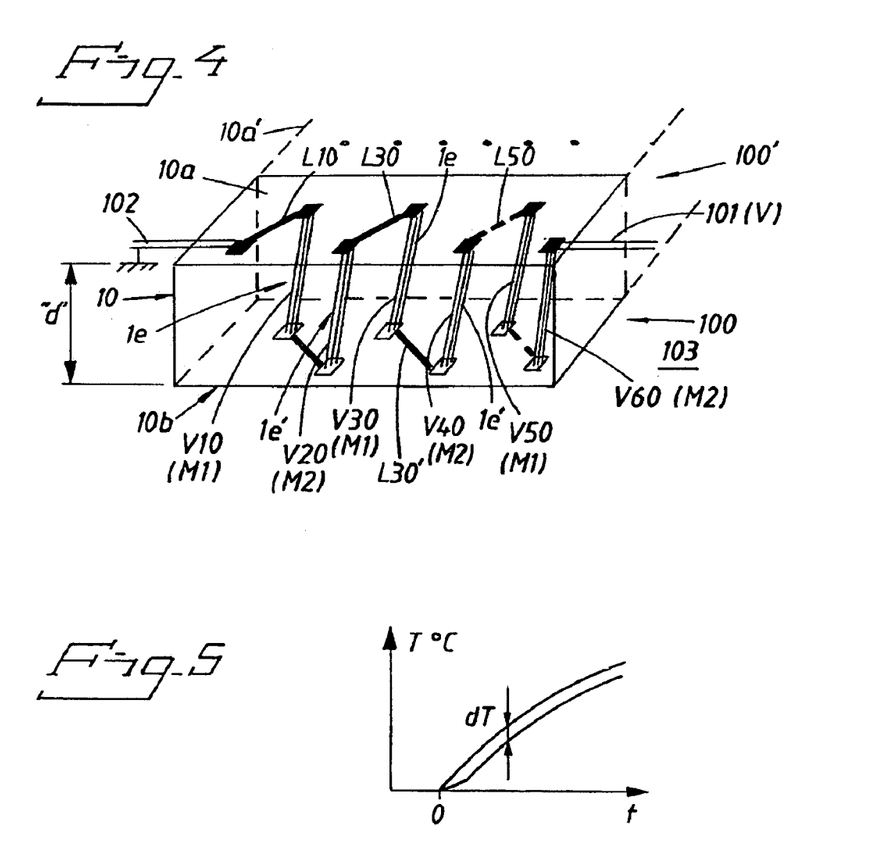
FIG. 4 shows in a perspective illustration an electric thermocouple, in accordance with the provisions pertaining to the present invention.
FIG. 5 shows in a graph an example of the time-dependent temperature difference that will be able to be assigned to the hot joint of the thermocouple and the cold joint of the thermocouple, in an application according to the invention.

Not only FIG. 2, but also FIG. 4, illustrate solely a short section of the inductance alternatively a short section of the electric thermocouple 100 according to the present invention and it should be understood that a considerably greater number of microvias can and should be connected in series with each other in order to form a thermocouple 100.

Nothing prevents from, on the same thin film material 1, forming a plurality of individual thermocouples connected in series in accordance with FIG. 4.

Nothing prevents from allowing to connect in parallel a plurality of such individual thermocouples 100 connected in series.

The processed thin film substrate 10 shown in FIG. 4 of an electric thermocouple 100 is adapted to be included as a signal receiver in a detector adapted for spectral analysis.

For a person skilled in the art it is evident that the surface section 10*a* of the electric thermocouple 100 may be repeated on a thin film substrate 10, such as at the reference designation 10*a*', and that thereby two electric thermocouples 100 and 100' may be presented on one and the same thin film sub substrate 10 and where said thermocouples 100 and 100', respectively, may be used for different rays or waves during a spectral analysis, where a thermocouple 100 may be used for the proper measurement and a thermocouple 100' may be used as reference measurement, with both signals being supplied, via said connection wires, to an electronic value-calculating circuit of a known type per se.

Within the scope of the present invention falls, according to FIG. 4, that selected parts or, as a bulk material, the outer surface 10*a* of the entire thin film substrate 10 should be treated with heavy accelerated ions "J", in order to, in this way, create conditions for not only utilizing certain microvias for different metals, interconnected as an electric thermocouple, but likewise enabling the creation of conditions for the formation of another electric circuitry and circuit arrangement, of the previously known form, inside the thin film substrate.

According to the present invention and the application thereof taught here, it is required that the kinetic energy allocated to the particles or ions, should be chosen so that at least 80% of the particles with full certainty will pass through the chosen thickness of said thin film substrate 10, in order to, in this way, be able to ensure that the coordinated microvias become faultless connected through the thin substrate.

Since the invention is based on possibilities for a series connection of a plurality of microvias, having mutually equal or different materials, a certainty is required for such a series connection of through-hole related microvias via formed surface-related circuitry for the microvias completely passing up or down to the surfaces and giving electric contact.

Also according to the present invention, said real nano-tracks will be able to be formed by means of a masking or tenting process (the result of this is compared with pieces of embroideries on a surface area related to said thin substrate) and with, on that occasion, a first a number of selected real nano-tracks, via a chosen process and by masking, becoming filled with a first electrically conducting material in order to form first microvias.

A second number of selected real nano-tracks, via a chosen process and by masking, should also be filled, however, with a second electrically conducting material, in order to form second microvias and with said first vias and with said second vias being co-ordinated in order to present desired properties when they are interconnected as an electric thermocouple and/or to a circuit arrangement.

Thus, the present invention also teaches that a plurality of first microvias and a plurality of second microvias should be electrically interconnected by an electrically conducting material applied to one of the two surfaces of the thin film substrate via masking or tenting, for the formation of distinct conducting wires and circuitries.

Furthermore, it is taught that a plurality of first microvias and a plurality of second microvias should be electrically interconnected by an electrically conducting material applied to the second one of the two surfaces of the thin film substrate via masking ot tenting, for the formation of distinct conducting wires or circuitries.

Nothing prevents from, simultaneously with the formation of said conducting wires and circuitries, also providing transverse circuitries via other microvias inside the thin film substrate, in order to allow the inclusion of said vias as circuitry in other electric circuit arrangements.

Said thin film substrate 10 is selected from a plastic material and assigned a thickness between 200 and 30 μm, preferably between 120 and 50 μm, in order to, in this way, be able to present an electric thermocouple of a nature that will be described more closely in the following. The thickness should be able to be chosen between 100 and 75 μm.

More particularly, said thin film substrate 10 may consist of an aromatic polymer material, with an etching being made in an alkaline and/or oxidizing wet environment, while utilizing chemical agents for the formation of open real nano-tracks.

More particularly, it is indicated that the kinetic energy should be chosen to be between 200 and 7000 MeV per ion, where the ions with a chosen certainty, here set as at least 80%, should be able to pass through the thickness of the thin film substrate 10.

Said nano-wires 1$d$ occurring in the thin film substrate 10 may be formed by means of "Coulomb" explosions and/or subsequent thermal transient, which is shown more closely and described on page 18 in the previously mentioned publication.

Said selected latent traversing nano-wires or nano-tracks 1$d$ are processed, such as in a known way, in order to form real nano-tracks traversing the thin film substrate 10 and where, for this treatment, a sodium hypochlorite-containing or potassium oxide-containing solution can be utilized.

Furthermore, it is taught that said real traversing open nano-tracks 1$e$ should be able to be pre-processed, such as with ethanol, for a wetting of inner track surfaces.

With a reference to FIG. 5, there is illustrated a temperature-time-graph for temperatures allocated the hot joints and temperatures allocated the cold joints at an thermoelectric coupling proposed for a detector in spectral analysis and where an assigned temperature difference "dT" can be regarded as depending on at least the following factors:

a) the light intensity for light waves incident against the upper surface 10$a$,
b) the frequency of the light intensity between two consecutive pulses,
c) the upward gradient characteristics of the light intensity,
d) the length "d" of the microvia transverse to the thin film substrate 10,
e) the calculated thickness "t" of the microvia transverse to the thin film substrate 10,
f) the distance between adjacent microvias, with the distance "a" (FIG. 3) constituting the distance between the vias "V2" and "V3" while the distance "a1" constitutes the distance between the vias "V2" and "V4",
g) heat transfer occurring between the microvias and the bulk material,
h) chosen material in the bulk material or the thin film substrate 10,
i) chosen heat conduction from the lower surface 10$b$ to a substratum 103,
j) the number of real nano-tracks connected in parallel in forming the respective microvia,
k) the calculated thickness of said real nano-tracks.

The embodiment according to FIG. 4 illustrates and manifests the utilization of a number of different parameters, each one adapted to an electric thermocouple.

It is quite natural that an increase of the length "d" of the microvia "V10" and other microvias, admittedly, will be able to present a large signal "V" but also gives a larger delay of occurring temperature differences, since an occurring increase of heat on the surface 10$a$ will, via a heat conduction to the surface 10$b$, pass a longer distance.

A thicker microvia or a microvia consisting of an excess plurality of real nano-tracks increases the heat conduction to the surface 10$b$.

A number of thinner microvias offer larger heat conduction to the bulk material than a thicker microvia having the same cross-section area. One single thick microvia gives a lower temperature gradient than a number of thin microvias.

A thinner microvia gives a higher electric resistance value than a thicker microvia.

A greater number of microvias, interconnected in series in the way that has been prescribed, gives a higher output signal than at fewer microvias.

An additional parameter, which may be assigned the conditions of an electric thermocouple, is that the time-related character of a utilized light source or lamp will affect occurring temperature difference.

However, it has turned out that if a lamp is controlled via pulses, whereby the lamp is assigned a chosen frequency of emitted light pulses, this frequency should be chosen to appear during 0,1 sec, at a thin film substrate having a thickness "d" of 100 μm.

Another condition is that the microvias should have a predetermined resistance value and where the same value should be as low as possible, say less than 100 Ω, however resistance values of the electric thermocouple of up to or equal to 30–50 kΩ should have to be accepted.

Figure 6:
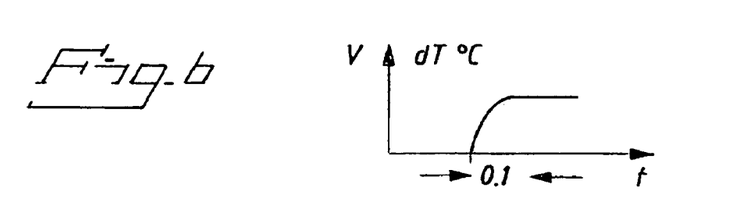
FIG. 6 shows the time-dependent alteration of the temperature difference and with the alteration corresponding to a voltage or electromotive force (EMF) given by the thermocouple.

FIG. 6 illustrates time-dependent development of the temperature difference and where said graph also can be regarded as representing the output signal from the electric thermocouple 100.

Figure 7:
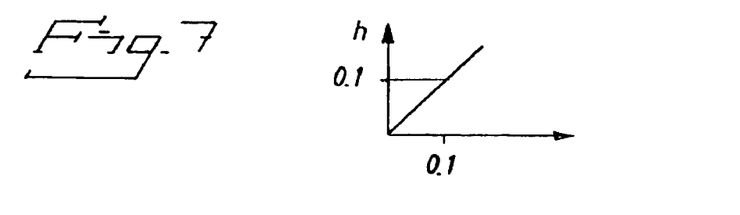
FIG. 7 shows a graph representing the relation between a chosen thickness for a thin film substrate and points of time when a maximum temperature difference occurs.

In FIG. 7, a graph is shown of how the height dimension or the thickness "d" of the thin film substrate is related to the output signal from the electric thermocouple and related to a repetition frequency of utilized light source or lamp.

An electric thermocouple, according to the present invention, should advantageously be constructed for an even number of microvias or co-ordinated microvias, with half the number consisting of a first material, such as the metal M1, and half the number consisting of a second material, such as the metal M2.

As a summary, it may be mentioned that the real nano-tracks and the microvias should be as thin as is practically possible and utilized metal material should have as poor thermal conductivity as possible.

The material pairs M1 and M2 should have as great a Seebeck-effect, thermoelectric effect or electomotive force (EMF) as possible.

Within the scope of the invention, of course possibilities falls to allow the utilization of electric fully conducting or semi-conducting material in the microvias and/or for the surface portions 10a and 10b, respectively, in order to, in this way, be able to construct various circuit arrangements, while utilizing at least two different materials.

Nothing prevents from, for the circuitry along the surfaces 10a and 10b, respectively, choosing a metal material that differs from the material that is utilized in the microvias.

Figure 8:
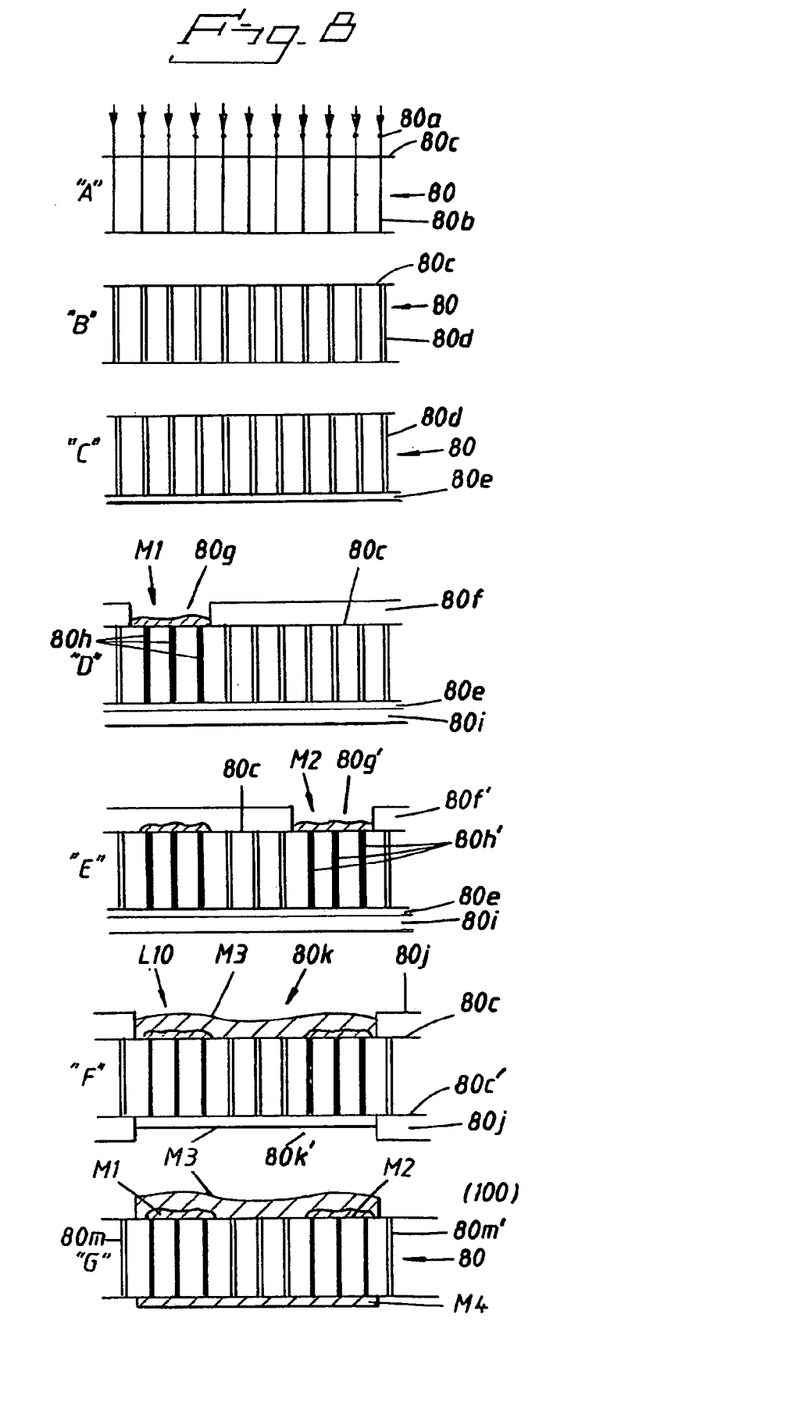
FIG. 8 shows a sequence, similar to the one illustrated in FIG. 1, of a method in a plurality of process steps in order to, from a bulk material structured as a thin film, enable the formation of a thermocouple or another circuit arrangement by means of at least two different metal materials.

In FIG. 8, a sequence is shown, similar to the one illustrated in FIG. 1, of a method divided into in a number of process steps "A"; "B" to "G", in order to, by means of a bulk material structured as a thin film, enable the formation of a thermocouple or another circuit arrangement, during the utilization of at least two, here illustrated by three, different metal materials M1; M2 and M3.

Thus, FIG. 8A shows that a bulk material 80, in the form of a thin film material, is exposed to a radiation while utilizing particles or ions 80a, and thereby traversing nano-wires 80b or latent nano-tracks 80b are formed.

Here, the entire top surface 80c of the material 80 is processed and the nano-wires 80b become well distributed, according to prior art in the same process step.

FIG. 8B illustrates that the nano-wires 80b formed in FIG. 8A are subjected to an etching process in a process step, in order to provide real nano-tracks 80d.

Here, the entire top surface 80c is processed so that the bulk material 80 exhibits a dense perforation of real nano-tracks 80d.

In FIG. 8C is illustrated that the material 80, processed according to FIG. 8B, is provided with a metal layer 80e in an additional process step.

FIG. 8D illustrates that in a process step, a photo-resist, a dry film 80f, having a masking and an opening 80g in order to lay bare three shown real nano-tracks 80h, is applied to the top surface 80c.

By a process step, comprising electro-plating, a metal material "M1" is applied so that the same material fills the nano-tracks 80h and is distributed inside the opening 80g.

FIG. 8D also shows that a resist 80i serving as a masking or protection film has been applied to the metal layer 80e.

FIG. 8E illustrates that in a subsequent process step, the dry film 80f is removed and a photo-resist, a dry film 80f, having an opening 80g' in order to lay bare three other shown real nano-tracks 80h', is applied to the top surface 80c.

By a repeated process step, comprising electro-plating, a metal material "M2" is applied so that the same material fills the nano-tracks 80h' and is distributed inside the opening 80g'.

FIG. 8F intends to illustrate that the film 80f' has been removed in one process step and in a subsequent process step, a new photo-resist 80j, a dry film, having a masking with an opening 80k, in order to lay bare the filled nano-tracks 80h and 80h', respectively, as microvias, is applied to the top surface 80c, and via electro-plating a metal material M3 is applied that forms requisite circuitry, such as the one designated by "L10".

FIG. 8F also intends to illustrate that the metal layer 80e and the protection film 80i' have been removed in one process steps and in a subsequent process step, a new photo-resist 80f', a dry film, having a masking in the form of an opening 80k', in order to lay bare the filled nano-tracks 80h and 80h', respectively, as microvias is applied to the bottom surface 80c', and via electro-plating a metal material M3 is applied that forms requisite circuitry, such as the one designated by "L30'" in FIG. 4.

FIG. 8G shows that in a process step, the photo-resists 80j and 80j' have been removed, and thereby a circuit arrangement (100) is at hand, having microvias and circuitry on the top side 80c and the bottom side 80c' of the thin film 80 electrically united and connected to each other.

In other embodiments, the materials "M1"; "M2", "M3" and "M4" may be chosen equal from metal materials having electrically conducting properties or mutually different from the material having different electrically conducting properties and/or from materials having electrically semi-conducting properties.

Furthermore, FIG. 8G illustrates that certain and chosen real nano-tracks 80m, 80m' that are not covered by metal material, may serve as air-ventilating and cooling ducts.

Figure 9:
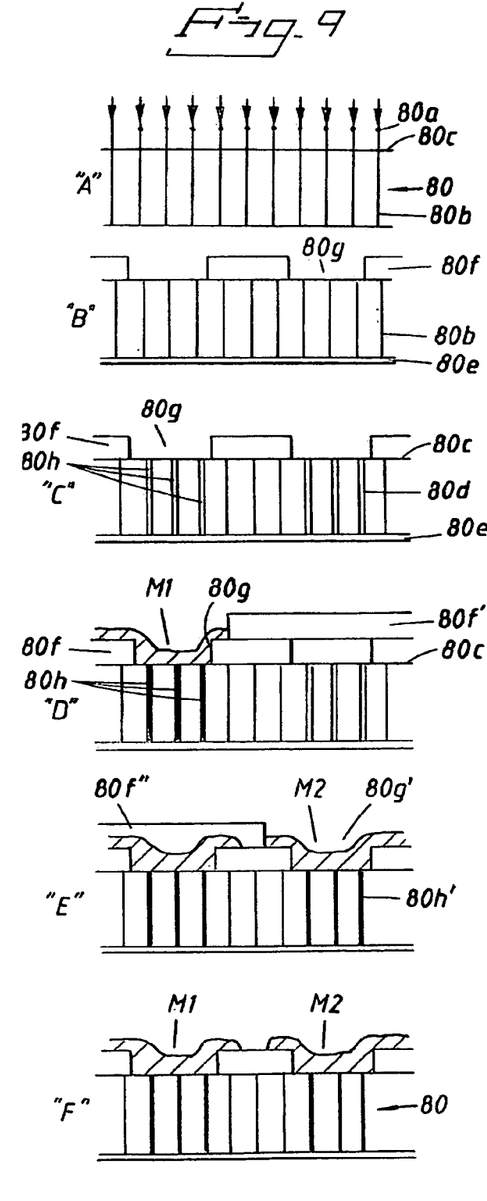
FIG. 9 shows a sequence, similar to the one illustrated in FIG. 8, of an alternative method in a plurality of process steps.

In FIG. 9, a sequence is shown, similar to the one illustrated in FIG. 8, of a method divided into in a number of process steps "A"; "B" to "F" in order to, by means of a bulk material structured as a thin film, enable the formation of a thermocouple or other circuit arrangement during the utilization of at least two, here illustrated by three, different metal materials M1; M2 and M3.

Thus, FIG. 9A shows that a bulk material 80, in the form of a thin film material, is exposed to a radiation while utilizing particles or tons 80a, and thereby traversing nano-wires 80b or latent nano-tracks 80b are formed.

Here, the entire top surface 80c of the material 80 is processed and the nano-wires 80b become well distributed, according to prior art in the same process step.

FIG. 9B illustrates that the nano-wires 80b, formed in FIG. 9A, are covered by a photo-resist 80f and, via a masking and its openings 80g, they are subjected to an etching process in a process step according to FIG. 9C, in order to provide selected real nano-tracks 80d.

Here, solely selected parts of the top surface 80c are processed so that the bulk material 80 exhibits a chosen perforation of real nano-tracks 80d.

In FIGS. 9B and 9C is illustrated that the material 80 is provided with a metal layer 80e in an additional process step.

FIG. 9D illustrates that in a process step, a photo-resist, a dry film 80f, having an opening 80g in order to lay bare three shown real nano-tracks 80h, is applied to the top surface 80c.

By a process steps, comprising electro-plating, a metal material "M1" is applied so that the same material fills the nano-tracks 80h and is distributed inside the opening 80g.

FIG. 9E illustrates that in a subsequent process step, the dry film 80f is removed and a photo-resist, a dry film 80f' having an opening 80g', in order to lay bare three other shown real nano-tracks 80h', is applied to the top surface 80c.

By a repeated process step, comprising electro-plating, a metal material "M2" is applied so that the same material fills the nano-tracks 80h and is distributed inside the opening 80g'.

Process steps illustrated previously according to FIGS. 8F and 8G succeed FIG. 9F and are, therefore, not shown.

Figure 10:
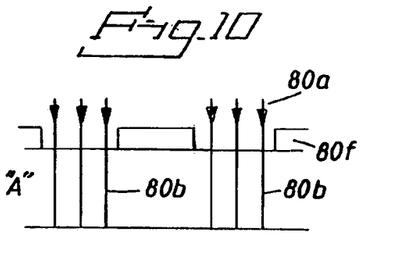
FIG. 10 shows an alternative for combining the two first process steps in FIG. 9 to a single process step.

FIG. 10 intends to illustrate that the radiation from the ion 80a is effected by a masking process or tenting, so that solely the latent nano-tracks and nano-wires 80b are formed inside the surface section that, subsequent to the above-described process steps, are to form microvias.

Even if the invention is illustrated in connection with a thermocouple, it is evident that said technique could be utilized also for other detectors, such as IR-detectors, such as movement detector and the like.

The invention is of course not limited to the embodiment given above as example, but may be subjected to modifications within the scope of the general idea according to the invention, illustrated in the subsequent claims.

Particularly, it should be taken into consideration that each unit shown may be combined with each another unit shown within the scope of the invention in order to be able to attain the desired technical function.

The invention claimed is:

1. A processed thin film substrate, in order to produce a printed circuit card or board, having a plurality of microvias going or passing through said thin film substrate and electrically connected along faced-away surfaces, in order to form an electric circuit, where; a; at least certain selected surface sections of the thin film substrate are treated with accelerated particles, b; that the velocity of said particles, when they hit said selected surface section, and the mass of the particles are mutually adapted to such values that the kinetic energy associated to the particle becomes chosen so that at least some particles, will pass through said thin film substrate, in order to allow the formation of nano-wires or latent nano-tracks traversing said thin film substrate, c; that selected latent traversing nano-tracks are processed in order to form real nano-tracks traversing the thin film substrate, d; that said real nano-tracks are filled with a material, having chosen electrically conducting properties, for the formation of said through-hole microvias, e; and that a plurality of through-hole micros or vias are electrically interconnected by means of at least one material applied to the faced-away surfaces of the thin film substrate and having chosen electrically conducting properties, a first number of said real nano-tracks being filled with a first material (M1), having chosen electric properties, for the formation of a first number of, here denominated, first vias (V10, V30, V50), while a second number of said real nano-tracks are filled with a second material (M2), having chosen electric properties, for the formation of a second number of, here denominated, second vias (V20, V40, V60), characterized in that the first material (M1) and the second material (M2) of selected first and second vias (V1–V60) are chosen having mutually different electric properties, that the material, surface-applied to the thin film substrate and coated on both sides of the thin film substrate, is distributed and/or adapted in order to allow the electrical interconnection of first vias, allocated said first material, with second vias, allocated said second material, and that a first via (V10) included in a series connection and a last via (V60) included in said series connection are co-ordinated for presenting an electric thermocouple and/or a circuit arrangement.

2. A thin film substrate according to claim 1, wherein a processed thin film substrate, having properties associated with a thermocouple, is adapted to be included as a signal receiver in a detector adapted for spectral analysis.

3. A thin film substrate according to claim 1, whereby during "a", the outer surface of the entire thin film substrate becomes treated with heavy accelerated ions.

4. A thin film substrate according to claim 1, whereby during "b", the kinetic energy allocated to particles is so chosen that at least 80% of the particles with certainty will pass through said thin film substrate.

5. A thin film substrate according to claim 1, whereby during "c", said real nano-tracks are formed by means of a masking process.

6. A thin film substrate according to claim 1, whereby during "d", selected real nano-tracks are, via a chosen process, filled with a first material, in order to form first vias.

7. A thin film substrate according to claim 1, whereby during "d", second selected real nano-tracks are, via a chosen process, filled with a second material, in order to form second vias.

8. A film substrate according to claim 1, whereby during "e", a plurality of first vias and a plurality of second vias are electrically interconnected by a material applied to one of the two surfaces of the thin film substrate via a masking process.

9. A thin film substrate according to claim 1, whereby during "e", a plurality of first vias and a plurality of second vias are electrically interconnected by a material applied to the second one of the two surfaces of the thin film substrate via a masking process.

10. A thin film substrate according to claim 1, whereby during "b", defined latent traversing nano-tracks initially consist of co-ordinated nano-wires formed inside the bulk material, in the form of nano-wires of an anisotropic material, which is susceptible to chemical etching for the formation of real nano-tracks.

11. A thin film substrate according to claim 1, wherein said thin film substrate is selected from a plastic material and has assigned a thickness between 200 and 30 μm.

12. A thin film substrate according to claim 1 wherein said thin film substrate consists of an aromatic polymer material, with an etching being carried out in an alkaline and/or oxidizing wet environment while utilizing chemical agents for the formation of open real nano-tracks.

13. A thin film substrate according to claim 1, whereby during "b", the kinetic energy is between 200 and 7000 MeV per ion.

14. A thin film substrate according to claim 1, whereby during "b", said nano-wires are provided by means of "Coulomb" explosions and/or via a thermal transient.

15. A thin film substrate according to claim 1, whereby during "c", a sodium hypochlorite-containing or potassium oxide-containing solution is utilized.

16. A thin film substrate according to claim 1, wherein said real traversing open nano-tracks formed during "c" are pre-processed for a wetting of inner track surfaces.

17. A method for processing a thin film substrate, in order to produce a printed circuit card or board, having a plurality of microvias going or passing through said thin film substrate and electrically connected along faced-away surfaces, in order to form an electric circuit, comprising a; treating at least certain selected surface sections of said thin film substrate with accelerated particles, such as in the form of ions, b; that the velocity of said particles, when they hit said selected surface section, and the mass of the particles is adapted to such values that the kinetic energy associated to the particle becomes chosen so that at least some particles, with full certainty, will pass through said thin film substrate, in order to allow the formation of nano-wires or latent nano-tracks traversing said thin film substrate, c; that selected latent traversing nano-tracks are processed, to form real nano-tracks traversing the thin film substrate, d; that said real nano-tracks, are filled with a material, having chosen electrically conducting properties, for the formation of through-hole microvias, e; and that a plurality of through-hole micros or vias are electrically interconnected by means of at least one material applied to the faced-away surfaces of the thin film substrate and having chosen electrically conducting properties, a first number of said real nano-tracks is filled with a first material (M1), having chosen electric properties, for the formation of a first number of, here denominated, first vias (V10, V30, V50), while a second number of said real nano-tracks are filled with a second material (M2), having chosen electric properties, for the formation of a second number of, here denominated, second vias (V20, V40, V60), characterized in that said first material (M1) and said second material (M2) of selected first and second vias (V10–V60) have mutually different electric properties, that the material, surface-applied to the thin film substrate and coated on both sides of the thin film substrate, is distributed and/or adapted in order to allow the electrical interconnection of first vias, allocated said first material, with second vias, allocated said second material, and that a first via (V10) included in a series connection and a last via (V60) included in said series connection are co-ordinated for presenting an electric thermocouple and/or a circuit arrangement.

18. A method according to claim 17, wherein a processed thin film substrate, having properties associated with a thermocouple, is adapted to be included as a signal receiver in a detector adapted for spectral analysis.

19. A method according to claim 17, wherein during "a", the outer surface of the entire thin film substrate is treated with heavy accelerated ions.

20. A method according to claim 17, wherein during "b", the kinetic energy to particles is at least 80% of the particles that with certainty will pass through said thin film substrate.

21. A method according to claim 17, wherein during "c", said real nano-tracks are formed by means of a masking process.

22. A method according to claim 17, wherein during "d", selected real nano-tracks are filled with a first material to form first vias.

23. A method according to claim 17, wherein during "d", second selected real nano-tracks are filled with a second material to form second vias.

24. A method according to claim 17, wherein during "e", a plurality of first vias and a plurality of second vias are electrically interconnected by a material applied to one of the two surfaces of the thin film substrate via a masking process.

25. A method according to claim 17, wherein during "e", a plurality of first vias and a plurality of second vias are electrically interconnected by a material applied to the second one of the two surfaces of the thin film substrate via a masking process.

26. A method according to claim 17, wherein during "b", defined latent traversing nano-tracks initially consist of co-ordinated nano-wires formed inside the bulk material, in the form of nano-wires of an anisotropic material, which is susceptible to chemical etching for the formation of real nano-tracks.

27. A method according to claim 17, wherein said thin film substrate is selected from a plastic material and assigned a thickness between 200 and 30 μm.

28. A method according to claim 17, wherein said thin film substrate consists of an aromatic polymer material, with an etching being carried out in an alkaline and/or oxidizing wet environment while utilizing chemical agents for the formation of open real nano-tracks.

29. A method according to claim 17, wherein during "b", the kinetic energy is chosen to be between 200 and 7000 MeV per ion.

30. A method according to claim 17, wherein during "b", said nano-wires are provided by means of "Coulomb" explosions and/or via a thermal transient.

31. A method according to claim 17, wherein during "c", a sodium hypochlorite-containing or potassium oxide-containing solution is utilized.

32. A method according to claim 17, wherein said real traversing open nano-tracks formed during "c" are pre-processed, with ethanol, for a wetting of inner track surfaces.

* * * * *